(12) United States Patent
Ghilardi et al.

(10) Patent No.: US 7,551,465 B2
(45) Date of Patent: Jun. 23, 2009

(54) REFERENCE CELL LAYOUT WITH ENHANCED RTN IMMUNITY

(76) Inventors: Tecla Ghilardi, Via Todeschini, 12, Trescore Balneario (IT) 24069; Paolo Tessariol, Via Gazie, 56, Montebelluna (IT) 31044; Giorgio Servalli, Via Cabina, 14/P, Ciserano (IT) 24040; Alessandro Grossi, Via Lario, 8, Milan (IT) 20159; Angelo Visconti, Via Colombo, 27, Appiano Gentile (IT) 22070; Emilio Camerlenghi, Via Tre Armi, 9/A, Bergamo (IT) 24128

(*) Notice: Subject to any disclaimer, the term of this patent is extended or adjusted under 35 U.S.C. 154(b) by 17 days.

(21) Appl. No.: 11/741,462

(22) Filed: Apr. 27, 2007

(65) Prior Publication Data
US 2008/0266929 A1 Oct. 30, 2008

(51) Int. Cl.
*G11C 5/02* (2006.01)
*G11C 7/02* (2006.01)
(52) U.S. Cl. ............... 365/51; 365/210.14; 365/210.15
(58) Field of Classification Search .............. 365/210, 365/51
See application file for complete search history.

(56) References Cited

U.S. PATENT DOCUMENTS

| | | | | |
|---|---|---|---|---|
| 5,734,602 A | * | 3/1998 | Guritz et al. | 365/104 |
| 5,880,989 A | * | 3/1999 | Wilson et al. | 365/145 |
| 2001/0033510 A1 | * | 10/2001 | Allen et al. | 365/145 |
| 2003/0012064 A1 | * | 1/2003 | Beretta | 365/200 |
| 2007/0109832 A1 | * | 5/2007 | Hou et al. | 365/63 |

OTHER PUBLICATIONS

Kurata, H., et al., "The Impact of Random Telegraph Signals on the Scaling of Multilevel Flash Memories," 2006 Symposium on VLSI Circuit, pp. 1-2.

* cited by examiner

*Primary Examiner*—Son L Mai
(74) *Attorney, Agent, or Firm*—Trop, Pruner & Hu, P.C.

(57) ABSTRACT

A reference cell layout includes a plurality of active areas, in parallel to each other, and a first contact of the active areas, and a first gate, the first contact shorting the active areas. A memory device includes the reference cell layout and a corresponding array of memory cells having active areas sized substantially identical to the active areas of the reference cell layout and plural second contacts respectively contacting the active areas of the memory cells.

20 Claims, 2 Drawing Sheets

REFERENCE CELL LAYOUT WITH ENHANCED RTN IMMUNITY

BACKGROUND

1. Technical Field

The present invention relates to a reference cell layout.

The invention particularly, but not exclusively, relates to a reference cell layout for a memory device of the Flash type and the following description is made with reference to this field of application for convenience of explanation only.

2. Description of the Related Art

As it is well known, a memory device, in particular of the Flash type, comprises an array of cells used to generate the reference currents for reading and verify operations of the memory device itself. These cells are usually indicated as reference cells.

It is also known that the commonly used reference cell layouts are normally designed like the memory cell ones. In this way, a good matching between reference and memory cells to be read is easily obtained.

More particularly, in the widely used CMOS technology, the active area scaling and the consequent reduction of the gate capacitance of the cells causes a worsening of Random Telegraph Noise or RTN immunity, due to the reduction of the total charge involved in threshold voltage determination, as described for instance in the article to Renesas Technology Corporation entitled: 'The Impact of Random Telegraph Signal on the Scaling of Multilevel Flash Memories', 2006 Symposium on VLSI circuit.

This charge reduction causes a fluctuation in the threshold voltage of the cells and consequently it could compromise the repeatability of the reading operations which substantially are threshold voltage readings.

The impact of the RTN is particularly critical for the reference cells since they are involved at each reading and verify operation of the memory device. Consequently, the threshold voltage indetermination induces a reduction of the reading margins of the memory device as a whole.

In particular, a "noise" affecting the measure of memory cells and compromising the repeatability of read information is not acceptable for any reliable memory device.

Moreover, along with the cells size scaling, a correct definition of small arrays, as in the case of the known reference cells, becomes more and more critical and requires challenging technology and design solutions.

BRIEF SUMMARY

An embodiment of this invention is directed to a reference cell layout having structural and functional characteristics which allow to reduce the RTN impact in memory devices by increasing the dimension of both active area width and gate width, in this way overcoming the limits which still affect the devices realized according to the prior art.

More specifically, advantageously according to this embodiment of the invention, the reference cell layout includes a plurality of active areas, in parallel to each other, a first contact and a first gate, the first contact shorting the active areas.

According to another embodiment of the invention, the number of active areas shorted by the first contact and the length of the first gate are chosen in order to match a reading gain of corresponding memory cells.

According to yet another embodiment of the invention, the first contact has at least one dimension greater than a corresponding dimension of a second contact of a memory cell and in particular a width equal to N times a width of the second contact, being N the number of active areas shorted by the first contact.

According to another embodiment of the invention, the reference cell layout further comprises a first gate having at least one dimension greater than a corresponding dimension of a second gate of the memory cell.

According to a further embodiment of the invention, the first gate has a length being larger than a length of the second gate.

Moreover, according to another embodiment of the invention, the active areas of the reference cells are designed as identical to the active areas of the memory cells.

A further embodiment of the invention is directed to a memory device comprising:

a reference cell array including at least a reference cell; and a memory cell array including at least a memory cell, the reference cells having a layout including a plurality of active areas, in parallel to each other, a first contact of the active areas, and a first gate, the first contact shorting the active areas.

According to another embodiment of the invention, the number of active areas shorted by the first contact and the length of the first gate are chosen in order to match a reading gain of the corresponding memory cell.

According to yet another embodiment of the invention, the first contact has a width equal to N times a width of the second contact, being N the number of active areas shorted by the first contact.

The characteristics and advantages of the reference cell layout and of the memory device according to the invention will be apparent from the following description of an embodiment thereof given by way of indicative and non limiting example with reference to the annexed drawings.

DETAILED DESCRIPTION

Figure 1:
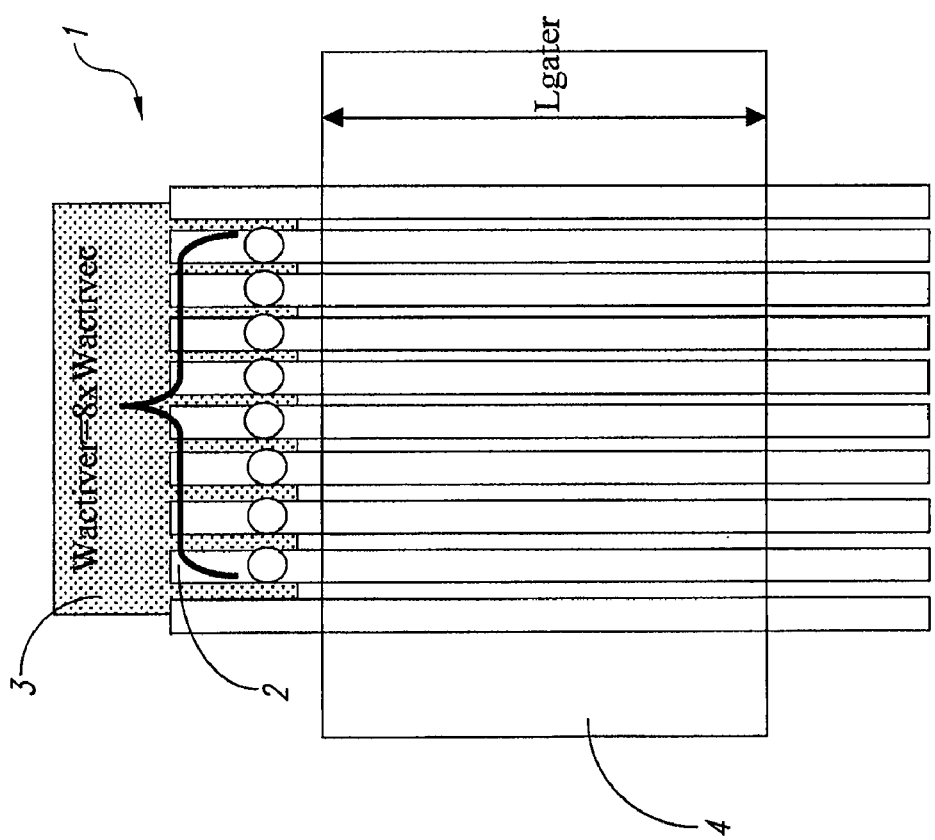
FIG. 1 schematically shows a reference cell layout according to an embodiment of the invention.

With reference to such figures, and in particular to FIG. 1, a reference cell layout according to an embodiment is generally shown at 1.

Advantageously according to an embodiment of the invention, the reference cell layout 1 includes a plurality of active areas 2, in parallel to each other, and a single contact 3 shorting the active areas 2. Moreover, the reference cell layout 1 also comprises a gate 4.

Moreover, advantageously according to a preferred embodiment of the invention, the number N of active areas 2 shorted by the first contact 3 and the length of the gate 4 are chosen in order to match a reading gain of the corresponding memory cell. In this case, a same decoding circuitry can be used for memory and reference cells.

Alternatively, in case of a mismatch in the reading gains of memory and reference cells, due to a different choice of the number N of shorted active areas 2 and gate 4 length, it can be always possible using a dedicated decoding circuitry for reference cells only.

According to the embodiment of the invention shown in FIG. 1, the single contact 3 has a dimension, in particular a width Wactiver greater than a corresponding dimension Wactivec of a memory cell contact.

Figure 2:
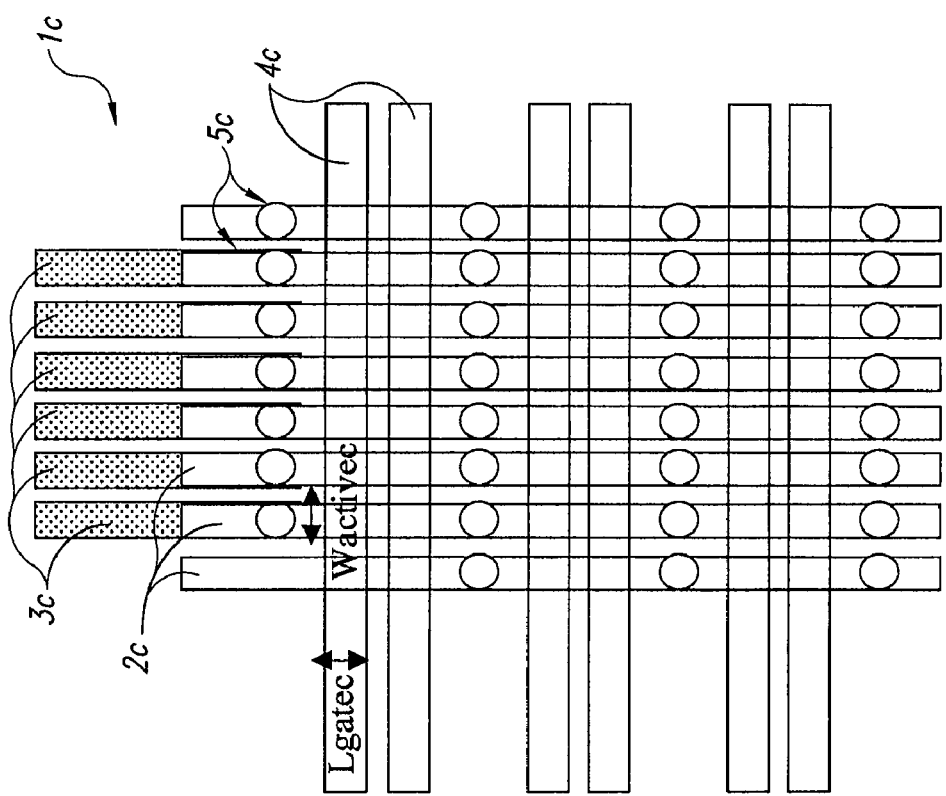
FIG. 2 schematically shows a memory cell layout of a memory device comprising reference cells having the layout of FIG. 1.

More particularly, FIG. 2 shows the layout of memory cells of a memory device comprising reference cells having the layout of FIG. 1. For co-operating details and parts having the same structure and operation of similar details as those in the layout of FIG. 1 the same reference numbers will be used followed by the letter "c".

It can be seen in FIG. 2 that the memory cell array layout 1c comprises a plurality of memory cells 5c implemented in a plurality of active areas 2c, each having a contact 3c, and the memory cells 5c include a plurality of gates 4c. Moreover, each contact 3c of the memory cell layout 1c has a dimension, in particular a width, indicated as Wactivec and each gate 4c has a dimension, in particular a length, indicated as Lgatec.

It should be remarked that, since the RTN impact in CMOS devices is proportional to 1/channel area, advantageously according to this embodiment of the invention, its effect on reference cells having the layout of FIG. 1 is reduced by increasing the dimension of the reference cell active area thanks to the shorting provided by the single contact 3 having a width Wactiver equal to N times the width Wactivec of the memory cell contact, being N the number of active areas 2 shorted by the contact 3 (N being equal to 8 in the example shown in FIG. 1).

Moreover, advantageously according to a preferred embodiment of the invention, the gate 4 has at least one dimension greater than a corresponding dimension of a memory cell gate 4c.

Therefore, the gate 4 of the reference cell layout 1 has a length Lgater being larger than a length Lgatec of the gate 4c of the memory cell layout 1c.

It should be remarked that for the above stated reasons, being the RTN impact in CMOS devices proportional to 1/channel area, advantageously according to this embodiment of the invention, its effect on reference cells is further reduced by increasing the dimension of the length Lgater of the gate 4.

Moreover, advantageously according to this embodiment of the invention, being the active areas externally shorted (by the contact 3, usually metal) a reference reading current is equal to the sum of a current of each active area 2.

It should be also emphasized that the number N of the active areas 2 to be shorted and the gate length Lgater are chosen in order to match a reading gain (being equal to DVth/DI) of memory cells of the memory array and to maintain almost the same erase and programming bias of such a memory array.

If the reference cells have exactly the same reading curve I(V) and program/erase performances of the memory cells, also a single decoding circuit can be used for memory and reference cells, thus guaranteeing a perfect matching in reading operations. This is particularly important for multilevel devices requiring a strong precision in reading operations.

Alternatively, the mismatch in the reading gains of memory and reference cells can be dealt with a separate or dedicated decoding circuitry.

Moreover, advantageously according to one embodiment of the invention, the active areas 2 of the reference cell layout 1 are designed as identical (in terms of width, spacing, shape) to the active areas 2c of the memory cell layout 1c.

In this way, no different morphologies are required to realize the reference cell layout 1.

This is a key point for all advanced process technologies wherein, in order to guarantee the target dimension for all devices, even in much scaled technology, it is important to reduce the number of different morphologies to be guaranteed by the process control.

In other words, the reference cell layout 1 according to one embodiment of the invention does not introduce any additional criticism to the manufacturing process of both memory and reference cells.

Figure 3:
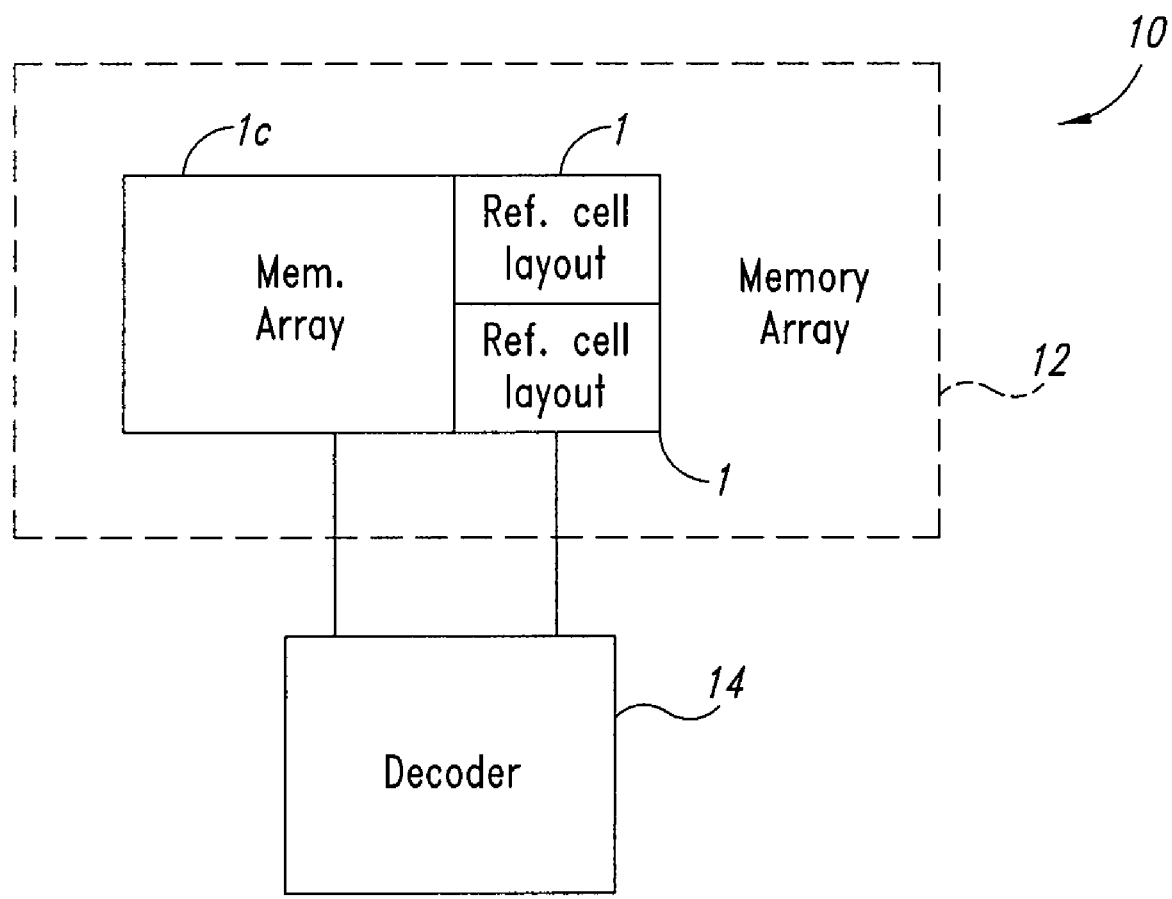
FIG. 3 schematically shows a memory device according to one embodiment of the invention.

FIG. 3 schematically shows a memory device 10 according to one embodiment of the invention. The memory device includes a memory array 12 which includes one or memory reference cells 1, such as shown in FIG. 1, and an array 1c of memory cells 5c, such as shown in FIG. 2. The memory device 10 also includes a single decoder 14 coupled to the one or more reference cells 1 and the memory cells 5c. Alternatively, separate decoders could be employed for the reference cells 1 and memory cells 5c, respectively, if the reading gains of the reference cells 1 and memory cells 5c are mismatched.

From the foregoing it will be appreciated that, although specific embodiments of the invention have been described herein for purposes of illustration, various modifications may be made without deviating from the spirit and scope of the invention. Accordingly, the invention is not limited except as by the appended claims.

We claim:

1. A reference cell layout comprising:
   a plurality of active areas in parallel to each other;
   a first gate capacitively coupled to the active areas, wherein the first gate has at least one dimension greater than a corresponding dimension of a second gate of a corresponding memory cell; and
   a first contact shorting the active areas to each other.

2. The reference cell layout of claim 1 wherein the first gate has a length that provides the reference cell layout with a reading gain that matches a reading gain of a corresponding memory cell.

3. The reference cell layout of claim 2 wherein the first contact has at least one dimension greater than a corresponding dimension of a second contact of a corresponding memory cell.

4. The reference cell layout of claim 3 wherein the first contact has a width equal to N times a width of the second contact, N being the number of active areas shorted by the first contact.

5. The reference cell layout of claim 1 wherein the first contact is made of metal.

6. The reference cell layout of claim 1 wherein the first gate has a length larger than a length of the second gate.

7. The reference cell layout of claim 1 wherein the active areas are substantially identical in size to active areas of corresponding memory cells.

8. The reference cell layout of claim 1 wherein the first gate has a length larger than a length of a second gate of a corresponding memory cell.

9. A memory device comprising:
   a memory cell array including at least a memory cell; and
   a reference cell array including at least a reference cell, the reference cell having a layout including a plurality of active areas, in parallel to each other, a first gate capacitively coupled to the active areas, and a first contact shorting the active areas to each other, wherein the first gate has a length larger than a length of a second gate of the memory cell.

10. The memory device of claim 9 wherein the first gate has a length that provides the reference cell layout with a reading gain that matches a reading gain of the memory cell.

11. The memory device of claim 10 wherein the first contact has a width equal to N times a width of a second contact of the memory cell, N being the number of active areas shorted by the first contact.

12. The memory device of claim 11 wherein the first contact is made of metal.

13. The memory device of claim 9 wherein the active areas of the reference cell are substantially identical in size to an active area of the memory cell.

14. The memory device of claim 9 wherein the reference cell has a same reading curve and program/erase performances of the memory cell, the memory device further comprising a single decoding circuit coupled to the memory cell and reference cell.

15. A memory device comprising:
   a plurality of memory cells;
   a reference cell layout including a plurality of active areas spaced apart from each other and a first contact shorting the active areas to each other; and
   a second contact coupled to an active area of one of the memory cells, wherein the first contact has a width equal to N times a width of the second contact, N being the number of active areas shorted by the first contact.

16. The memory device of claim 15 wherein the reference cell layout has a gate having a length that provides the reference cell layout with a reading gain that matches a reading gain of one of the memory cells.

17. The memory device of claim 15 wherein the first contact is made of metal.

18. The memory device of claim 15 wherein the reference cell layout includes a first gate capacitively coupled to the active areas and the plurality of memory cells includes a plurality of active areas and a second gate capacitively coupled to the active areas of the plurality of memory cells, the first gate having a length larger than a length of the second gate.

19. The memory device of claim 15 wherein the plurality of memory cells includes a plurality of active areas spaced apart from one another, the active areas of the reference cell layout being substantially identical in size to the active areas of the plurality of memory cells.

20. The memory device of claim 15 wherein the reference cell layout has a same reading curve and program/erase performances of the plurality of memory cells, the memory device further comprising a single decoding circuit coupled to the memory cells and the reference cell layout.

* * * * *